United States Patent [19]

Zhong et al.

[11] Patent Number: 5,970,104
[45] Date of Patent: Oct. 19, 1999

[54] METHOD AND APPARATUS FOR GENERATING BRANCH METRICS AND BRANCH INDICES FOR CONVOLUTIONAL CODE VITERBI DECODERS

[75] Inventors: Yan Zhong, Sunnyvale; Lin Yang, Fremont; Manouchehr Rafie, Sunnyvale, all of Calif.

[73] Assignee: Cadence Design Systems, Inc., San Jose, Calif.

[21] Appl. No.: 08/820,922

[22] Filed: Mar. 19, 1997

[51] Int. Cl.[6] .................................................. H03D 1/00
[52] U.S. Cl. ........................ 375/341; 371/30; 371/43.7
[58] Field of Search .......................... 371/43.4, 30, 43.8, 371/43.7; 375/341, 316, 324

[56] References Cited

U.S. PATENT DOCUMENTS

| | | | |
|---|---|---|---|
| 4,536,878 | 8/1985 | Rattlingourd et al. | 371/43 |
| 4,748,626 | 5/1988 | Wong | 371/30 |
| 4,757,506 | 7/1988 | Heichler | 371/43 |
| 5,390,198 | 2/1995 | Higgins | 371/43 |
| 5,594,742 | 1/1997 | Hemmati | 371/37.1 |
| 5,742,622 | 4/1998 | Claydon et al. | 371/46 |

*Primary Examiner*—Stephen Chin
*Assistant Examiner*—Joseph Roundtree
*Attorney, Agent, or Firm*—Robert P. Sabath, Esq.

[57] ABSTRACT

A Viterbi decoder generates a branch metric table from first and second data signals taken at two sample times and provides selected branch metrics to an add/compare/select circuit in response to branch indices from a branch index generator. The branch metrics in the branch metric table are the sixteen combinations of the sum of the first and second parallel data signals at first and second sample times and the inverse of such signals. The branch index generator generates the branch indices in response to a received state from the add/compare/select circuit, convolutional code polynomials and the possible states of a radix-4 trellis. The add/compare/select generates a survivor path decision based on the selected branch metrics.

7 Claims, 7 Drawing Sheets

METHOD AND APPARATUS FOR GENERATING BRANCH METRICS AND BRANCH INDICES FOR CONVOLUTIONAL CODE VITERBI DECODERS

FIELD OF THE INVENTION

This invention relates to a Viterbi decoder, and more particularly to a rate equals one-half convolutional code Viterbi decoder that generates a branch metric.

BACKGROUND OF THE INVENTION

Communication systems use convolutional encoding of data for error detection and correction. The receiver of the communication system convolutionally decodes the encoded data to reconstruct the initial transmitted data. One well-known method of convolutional code decoding is the Viterbi algorithm. The Viterbi algorithm determines either the shortest or longest path to each current state from states that occur previously. A brute force method for such determination is to determine the length of all possible paths. This takes large amounts of memory, processing capability, and time. Instead, the Viterbi algorithm determines the current state from the previous state which is remembered and accumulates the data, called metrics. The Viterbi algorithm may be implemented either in hardware or software or both. Recently the Viterbi decoders have been implemented as application specific integrated circuits (ASIC) using very large integration (VLSI) technology. Tradeoffs between performance and cost in the hardware implementation is a very critical issue. Many different architectures have been used.

These architectures are inflexible in that their design does not provide simple scalability. It is desired to have a Viterbi decoder that allows expansion for increasing numbers of states and that allows a decoder architecture that can be fully parallel, fully serial, or partially parallel, partially serial.

SUMMARY OF THE INVENTION

The present invention provides a method for generating branch metric indices for Viterbi decoding. States of an encoder are generated at first and second times. Output data are generated in response to the states of the encoder and generated polynomials. A branch metric index is generated in response to the output data. The output data may be generated as a convolution of the generated states and the generator polynomials.

First and second data signals are generated in response to received data at first and second times. A branch metric table is generated which includes elements that are representative of the sum of the sums of the first and second signals at first and second times and their inverses. Branch metrics corresponding to the generated branch indices are retrieved from the branch metric table.

The Viterbi decoder comprises a state generator that generates first and second pluralities of states indicative of received data at respective first and second times. A branch metric generator generates a plurality of branch metrics that each correspond to branch transitions between the first and second pluralities of states in response to the first and second plurality of states and convolutional code polynomials. A selection circuit selects, for each one of the first plurality of states, a corresponding one of the second plurality of states in response to the branch metrics corresponding to said each one of the first plurality of states. The Viterbi decoder preferably is a radix-4 decoder. The state generator may be a shift register that provides state signals indicative of shifted bits of the received data.

DETAILED DESCRIPTION OF THE PREFERRED EMBODIMENTS

Figure 1:
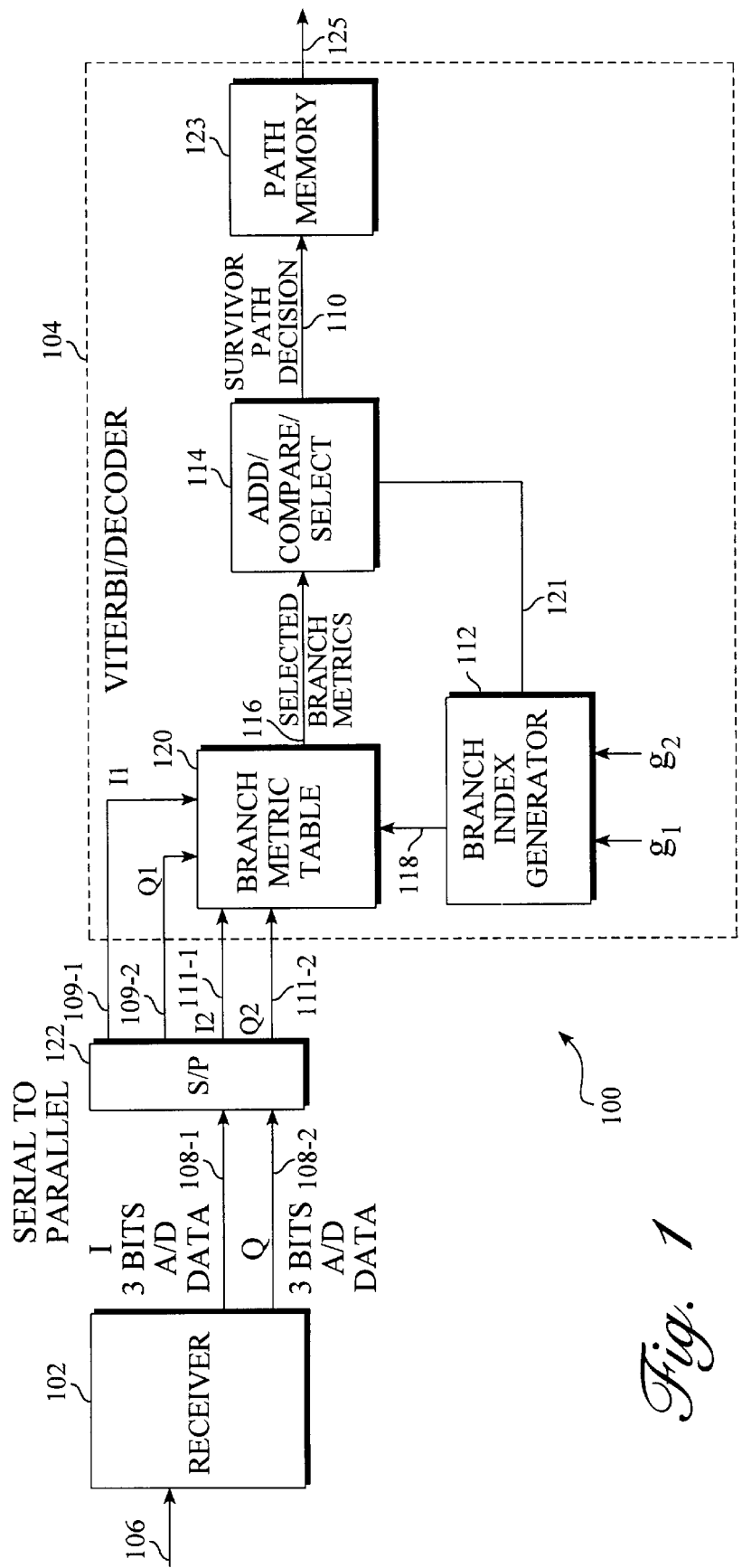
FIG. 1 is a block diagram of a convolutional code decoder in accordance with the present invention.

FIG. 1 is a block diagram of a convolutional code decoder 100 in accordance with the present invention. The convolutional code decoder 100 includes a receiver 102, a Viterbi decoder 104, and a serial-to-parallel converter 122.

An input signal 106 having encoded data therein is applied to an input of the receiver 102. The input signal 106 may be received, for example, from an antenna, a cable, an optical detector, or the like. In response to the input signal 106, the receiver 102 processes the input signal 106 in a conventional manner and generates output data 108 which includes a first data (I) signal 108-1 and a second data (Q) signal 108-2. The receiver 102 may be, for example, a conventional receiver. The receiver 102 may down-convert the input signal 106 from a modulated carrier frequency to base band in a conventional manner. In one embodiment of the present invention, the output data 108 are serial bits representative of a sample from an analog to digital converter (not shown) of the receiver 102. For clarity and simplicity, the output data 108 is described herein as a three bit signal. In one embodiment of the present invention, the output data 108 at each symbol time is a pair of datum indicative of two bits of encoded data.

The first data signal 108-1 and the second data signal 108-2 are applied to the serial-to-parallel converter 122, which generates first and second parallel data signals 109 and 111 for first and second bit times, respectively. The serial-to-parallel converter 122 converts the serial output data 108 at a first bit time to first parallel data signal ($I_1$) 109-1 and second parallel data signal ($Q_1$) 109-2. The serial-to-parallel converter 122 also converts the serial output data 108 at a subsequent second bit time to first parallel data signal ($I_2$) 111-1 and second parallel data signal ($Q_2$) 111-2. The serial-to-parallel converter 122 applies the first parallel data signal ($I_1$) 109-1, the second parallel data ($Q_1$) signal 109-2, the first parallel data ($I_2$) signal 111-1, and the second parallel data ($Q_2$) signal 111-2 to respective inputs of the Viterbi decoder 104. Consequently, four data signals are applied to the Viterbi decoder 104. In one embodiment of the present invention, the encoded data 106 is a serial bit stream of data. In one embodiment of the present invention, the four parallel data signals 109 and 111 are parallel bit signals. Using the encoded data 108, the Viterbi decoder 104 calculates, at pre-selected times, branch metrics, branch indices and state metrics for the data, and determines the path of the data that has the greatest likelihood of occurrence. The Viterbi decoder 104 generates an output decoded data signal 125 indicative of the data that is most likely to have been transmitted, given the received data during a noisy transmission.

The Viterbi decoder 104 includes a branch index generator 112, an add/compare/select circuit 114, a branch metric table 120, and a path memory 123. The first parallel data signals 109 and the second parallel data signals 111 are applied to the branch metric table 120. The add/compare/select circuit 114 generates a state signal 121 which is applied to the branch index generator 112. For each possible state of the radix-4 trellis diagram 200 (FIG. 2), the branch index generator 112 applies branch indices 118 to the branch metric table 120 which in response provides selected branch metrics 116 to the add/compare/select circuit 114. In response to receipt of the branch metrics 116, the add/compare/select circuit 114 generates an output data signal 110 and applies the data to the path memory 123, which provides decoded data 125 to an external system (not shown), such as a processor. The data signal 110 is a survivor path decision in accordance with one embodiment of the present invention.

Figure 2:
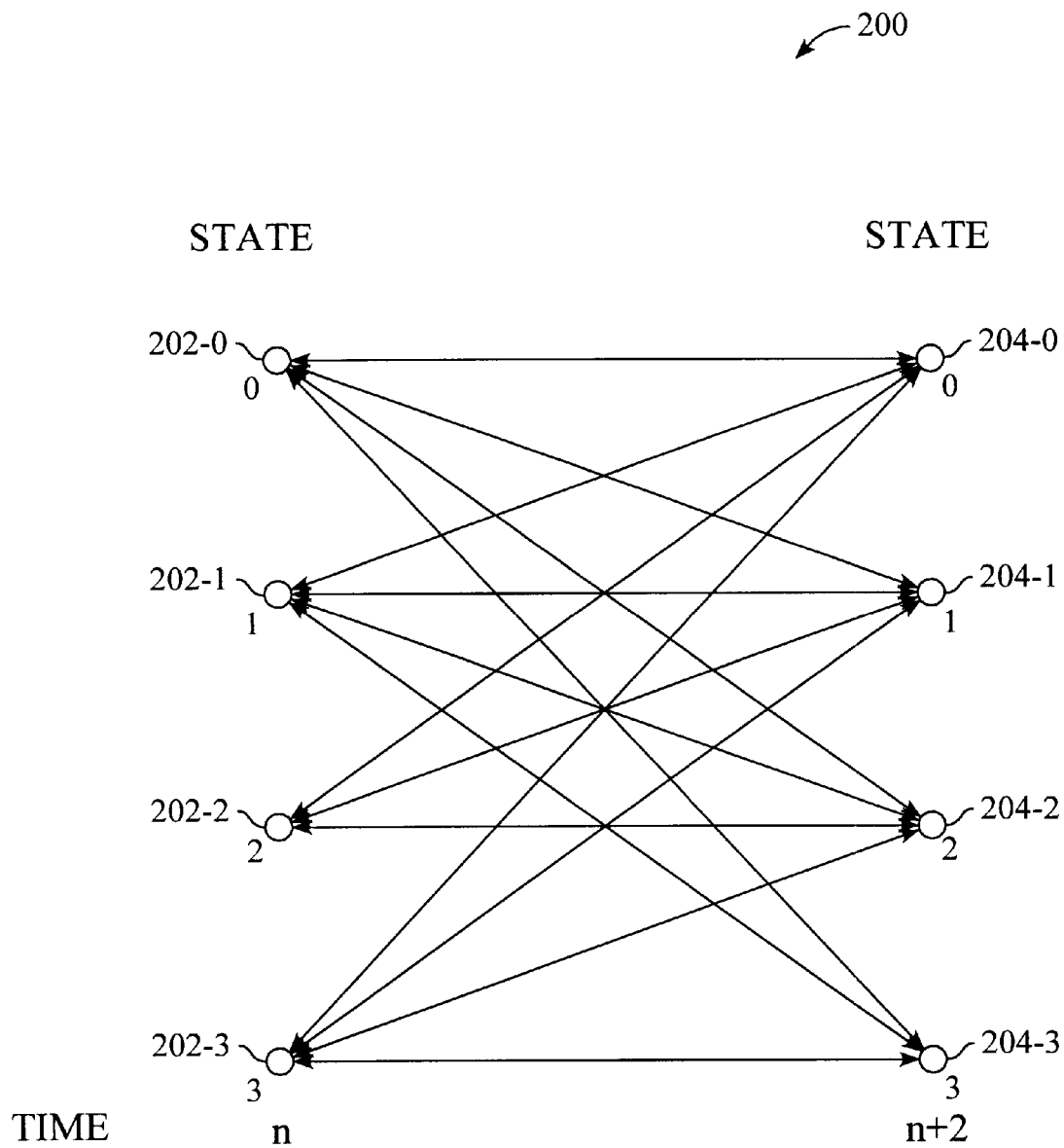
FIG. 2 is a block diagram illustrating a radix-4 trellis diagram.

FIG. 2 is a block diagram illustrating a radix-4 trellis diagram 200, which is an abstraction of the Viterbi decoding process. Specifically, the radix-4 trellis diagram 200 is an abstract depiction of the possible states of the encoded data over a sequence of data times. For simplicity, only states at two data times, n and n+2, are shown in FIG. 2. At each data time, the Viterbi decoder 106 receives data that may be in one of a plurality of states. The illustrated trellis diagram 200 is a radix-4 trellis in which four possible states, 202-0 through 202-3, can occur at a first time n. At a second time n+2, the radix-4 trellis diagram 200 has four possible states, 204-0 through 204-3. The branch transitions from the states 202 to the states 204 are indicated by the arrows connecting the states 202 and 204. Because there are four possible states at each data time, two bits define the state. Because the encoded data 106 is a single bit serial data stream, it takes two time intervals, n and n+1, to transition from one of the states 202 to one of the states 204. The branch index generator 112 selects, for each possible previous state 202, a branch metric λ indicative of the branch transition from the previous state 202 to the current state 204 from the branch metric table 120 (FIG. 1). The Viterbi decoder 104 then calculates, for each possible previous state, a state metric which is the sum of the state metric of the previous state and the branch metric λ of the branch transition from such state to the current state. Each current state thus has a candidate state metric for each possible previous state 202 to the current state 204. The Viterbi decoder 104 selects the previous state that provides the smallest state metric. In one embodiment of the present invention, the Viterbi decoder 104 selects the candidate previous state 202 that provides the smallest state metric to the current state 204. This previous state, with the transition to the current state, becomes the path through the trellis to the current state.

An example of the selection of the transition is now described. Assume, for example, the state 204-0 is being analyzed. As shown in FIG. 2, the state 204-0 can be reached from any state 202-0 through 202-3. The Viterbi decoder 104 generates a branch metric λ for the branch transition from state 202-0 to the state 204-0 and adds such branch metric to the state metric for the state 202-0 to generate a candidate state metric for state 204-0. Likewise, a branch metric is calculated for the branch transition from state 202-1 to the state 204-0, and such branch metric is added to the state metric of state 202-1 to generate a candidate state metric for the transition from state 202-j (j=1) to state 204-0. Similar candidate state metrics for state 204-0 are generated for states 202-2 and 202-3. The candidate state metric having the smallest state metric is selected, and the branch corresponding to such selected state metric accordingly is selected. As noted above, FIG. 2 shows only the trellis diagram for the states at two data times n and n+2. However the process is repeated for later data times n+4, n+6 and so forth. As the previous states are selected for each state at the data time under evaluation, the state metric is accumulated and the path through the trellis also is accumulated. By making this branch selection at each data time, instead of recalculating the path before the previous state, the Viterbi decoder 104 performs less calculations.

In the radix-4 trellis diagram 200, for a branch transition from a state i at time n to a state j at time n+2, the radix-4 branch metric $\lambda'_{ij,n}$ can be expressed as $$\lambda'_{ij,n} = \lambda_{ik,n} + \lambda_{kj,n+1} \quad (1)$$

where k is the intermediate state to which the combined branch passes at time n+1. The quantities $\lambda_{ik,n}$ and $\lambda_{kj,n+1}$ are branch metrics of transition from state i at time n to state k at time n+1, and from state k at time n+1 to state j at time n+2, respectively. Because the trellis is radix-4, two data bits are used for the decoding so that the branch metric calculation is performed every two data times. In one embodiment of the present invention, the branch metrics λ are a distance measure between two successively received noisy symbols and the ideal encoder outputs of the specified state transitions of the trellis.

Figure 3A:
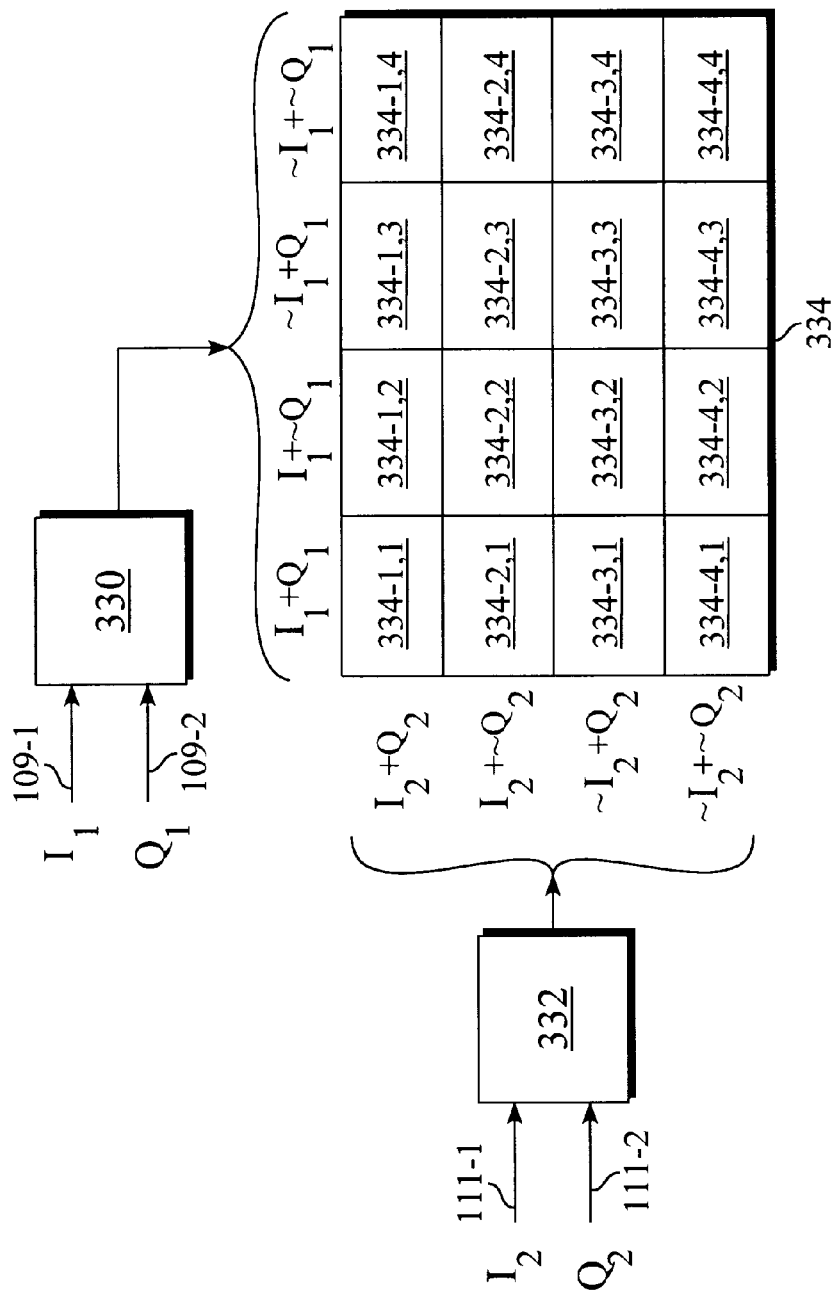
FIG. 3a is a block diagram of a branch metric table of a Viterbi decoder of the convolutional code decoder of FIG. 1.

FIG. 3a is a block diagram of the branch metric table 120 (FIG. 1) in accordance with the present invention. The branch metric table 120 includes first and second adders 330 and 332, respectively, and a memory 334. The $I_1$ signal 109-1 and the $Q_1$ signal 109-2 are applied to respective inputs of the adder 330, which generates an inverted value $\sim I_1$ of the $I_1$ signal 109-1 and an inverted value $\sim Q_1$ of the $Q_1$ signal 109-2 and the four combinations of the sums: $I_1+Q_1, I_1+\sim Q_1, \sim I_1+Q_1$ and $\sim I_1+\sim Q_1$. These combinations are the metrics $\lambda_{ik,n}$. Likewise, the $I_2$ signal 111-1 and the $Q_2$ signal 111-2 are applied to respective inputs of the second adder 332 which generates the inverted signals $\sim I_2$ and $\sim Q_2$ corresponding to respective $I_2$ signal 111-1 and $Q_2$ signal 111-2. The complex number adder 332 generates the four combinations of additions; $I_2Q_2, I_2+\sim Q_2, \sim I_2+Q_2$, and $\sim I_2+\sim Q_2$. These combinations are the metrics $\lambda_{kj,n+1}$. Each combination of the sum of the four combinations of the $I_1$ and $Q_1$ signals 109 and four combinations of the $I_2$ and $Q_2$ signals 111 are stored in the memory 334. For example, element 334-1,1 stores the sum of $I_1+Q_1+I_2+Q_2$. Likewise, the element 334-3,3 stores the sum of $\sim I_1+Q_1+\sim I_2+Q_2$.

The branch metric table 120 operates as a lookup table for generating branch metrics 116. Specifically, the branch index generator 112 applies the branch indices 118 to the branch metric table 120 which in response selects from the table the selected branch metrics 116.

The sixteen selections that are stored in the memory 334 represent a reduced set of data that needs to be stored for calculating the branch metrics 116. For example, in a system having 64 states, only the sixteen elements of the memory 334 are stored for any one transition. This arrangement reduces the size of the memory from storing 256 values (the 64 states times the four possible transitions) to sixteen values.

Figure 3B:
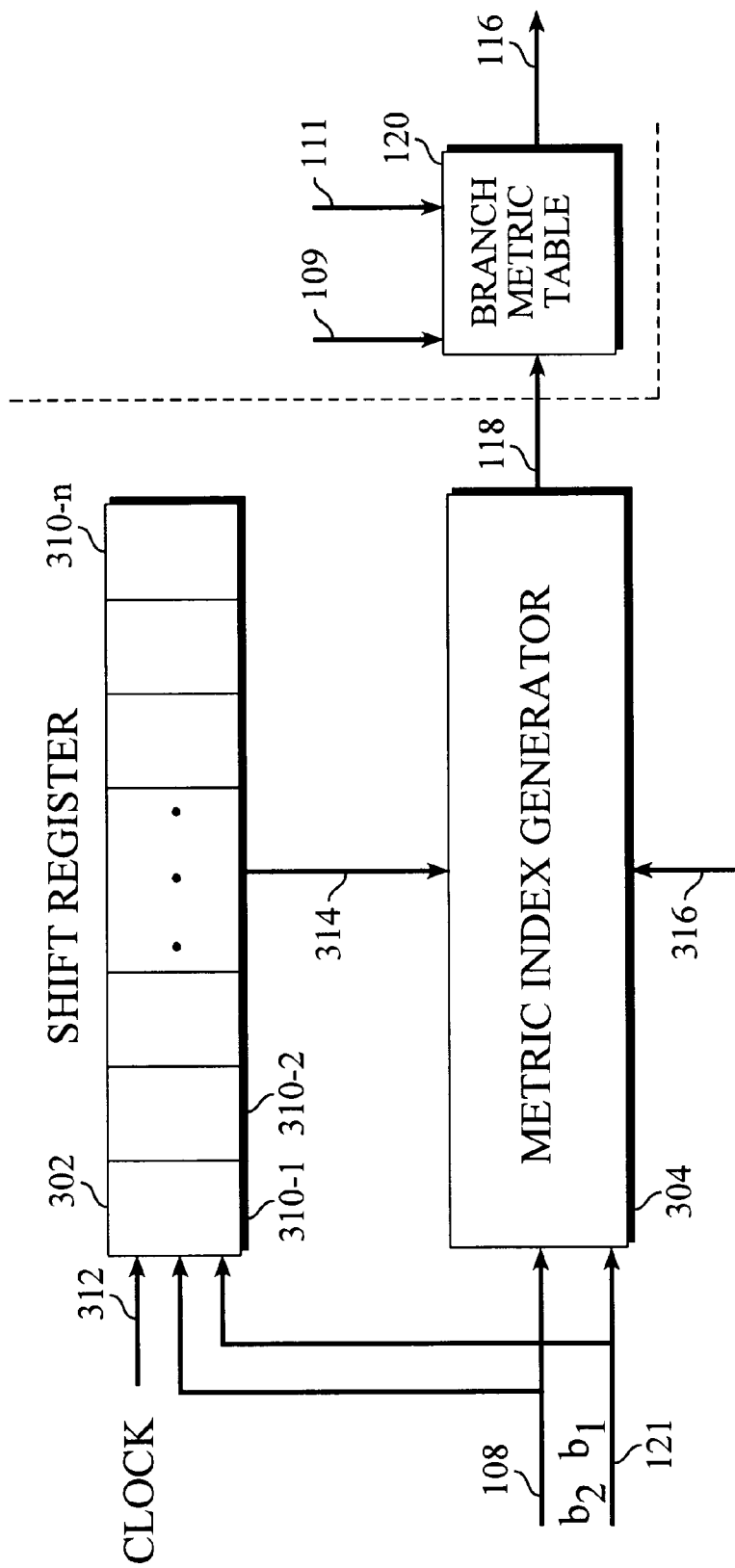
FIG. 3b is a block diagram of a branch index generator of the Viterbi decoder of the convolutional code decoder of FIG. 1.

FIG. 3b is a block diagram of the branch index generator 112 (FIG. 1) in accordance with the present invention. The branch index generator 112 includes a shift register 302 and a metric index generator 304. The shift register 302 includes a plurality of registers 310-1 through 310-n.

A rate=½ convolutional encoder is described. Other rates may be used by using puncture and depuncture to change the rate.

Two generator polynomials 316 are applied to the metric index generator 304. The two generator polynomials 316 can be expressed by the equations:

$$g^{(1)} = (g_0^{(1)} g_1^{(1)} \ldots g_{L-3}^{(1)} g_{L-2}^{(1)} g_{L-1}^{(1)}) \quad (2a)$$

$$g^{(2)} = (g_0^{(2)} g_1^{(2)} \ldots g_{L-3}^{(2)} g_{L-2}^{(2)} g_{L-1}^{(2)}) \quad (2b)$$

The generator polynomials 316 are indicative of the encoding applied to the transmitted data at an external transmitting system (not shown). Thus, for a known transmission encoding system, the generation of the generator polynomials 316 is predefined. Such generation of the generator polynomials 316 is well known in the art.

Figure 3C:
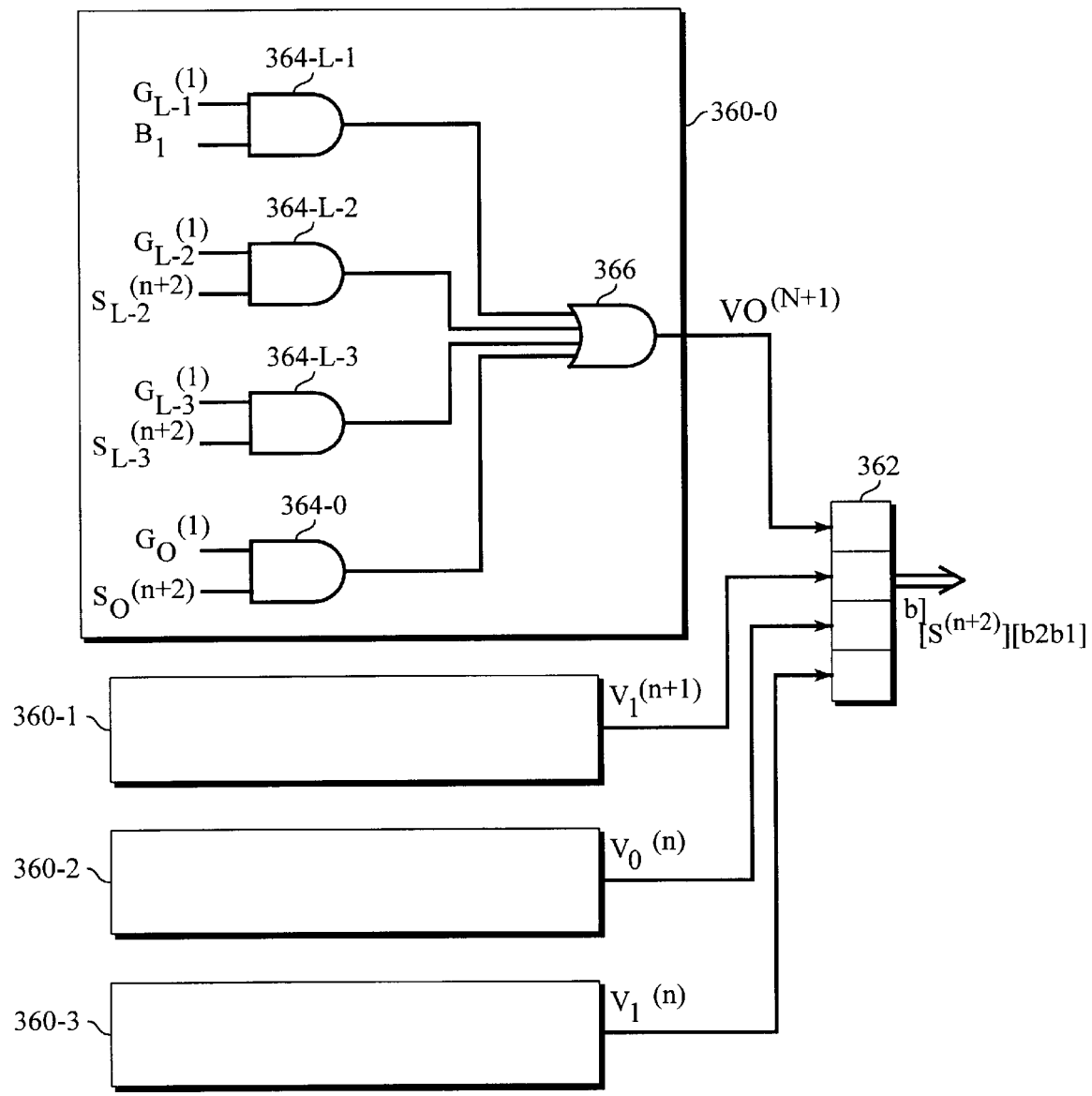
FIG. 3c is a block diagram illustrating a metric index generator of the branch index generator of FIG. 3c.

The encoded data 108 is applied to both the shift register 302 and the metric index generator 304. The state signal 121 is applied to another input of both the shift register 302 and the metric index generator 304. As described above, in a radix-4 trellis system, two bits are required for the metric generation. The two bits are shown in FIG. 3c as $b_2$ and $b_1$. In response to an applied clock signal 312, the shift register 302 shifts the encoded data 108 through successive registers 310-j (j=1, 2, . . . , n) at successive times. The registers 310 may be initialized to predetermined values, for example, all zeros. The shift register 302 provides an output signal 314 to the metric index generator 304.

The output signal 314 of the shift register 302 is the state of the decoder at the time of the output. At time n, the two bits of the branch metric index 118 from the branch metric index generator 304 are $v_n^{(0)}$ and $v_n^{(1)}$. At time n+1, the two bits of the branch metric index 118 are $v_{n+1}^{(0)}$ and $v_{n+1}^{(1)}$. The output signal 314 of the shift register 302 indicates the state of the decoder. The states of the decoder at time n and time n+2 are expressed by the equations:

$$S^{(n)} = (s_{L-2}^{(n)} s_{L-3}^{(n)} s_{L-4}^{(n)} \ldots s_1^{(n)} s_0^{(n)}) \quad (3a)$$

$$S^{(n+2)} = (s_{L-2}^{(n+2)} s_{L-3}^{(n+2)} s_{L-4}^{(n+2)} \ldots s_1^{(n+2)} s_0^{(n+2)}) \quad (3b)$$

The shift register 302 generates the state $S^{(n+2)}$ as the two-bit left-shift of the state S(n) with the right-most two bits equal to the input bits of the encoder at time n and time n+1. Or, conversely, $S^{(n)}$ is the two-bit right shift of $S^{(n+2)}$ by adding back the two shifted-out bits $\{b_2\ b_1\}$ to the left, with $\{b_2 b_1\} \in \{00, 01, 10, 11\}$. An extended state $S'^{(n)}$ at time n can be expressed as:

$$S'^n = (b_2\ b_1\ s_{L-2}^{(n+2)}\ s_{L-3}^{(n+2)}\ s_1^{(n+2)}\ s_0^{(n+2)}) \quad (4)$$

The extended state $S'^{(n)}$ is two bits longer than the state $S^{(n)}$.

FIG. 3c is a block diagram illustrating the metric index generator 304 (FIG. 3b) in accordance with the present invention. The metric index generator 304 includes a plurality of convoluted states signal generators 360-0 through 360-3 and a combining circuit 362. The metric index generator 304 generates the branch metric index 118 (FIG. 3b) by convolving the state $S^{(n)}$ of the encoded data, the encoded data 108, and the generator polynomials 316. The combining circuit 360 generates the two-bit branch metric index output defined by the convolutional equations:

$$v_0^{(n+1)} = g_{L-1}^{(1)} * b_1 + g_{L-2}^{(1)} * s_{L-2}^{(n+2)} + g_{L-3}^{(1)} s_{L-3}^{(n+2)} + \ldots + g_1^{(1)} * s_1^{(n+2)} + g_0^{(1)} * s_0^{(n+2)} \quad (5a)$$

$$v_1^{(n+1)} g_{L-1}^{(2)} * b_1 + g_{L-2}^{(2)} * s_{L-2}^{(n+2)} + g_{L-3}^{(2)} * s_{L-3}^{(n+2)} + \ldots$$
$$+ g_1^{(2)} * s_1^{(n+2)} + g_0^{(2)} * s_0^{n+2)} \quad (5b)$$

$$v_0^{(n)} = g_{L-1}^{(1)} * b_2 + g_{L-2}^{(1)} * b_1 + g_{L-3}^{(1)} * s_{L-2}^{(n+2)} + \ldots + g_1^{(1)} * s_2^{(n+2)} g_0^{(1)} * s_1^{(n+2)} \quad (5c)$$

$$v_1^{(n)} = g_{L-1}^{(2)} * b_2 + g_{L-2}^{(2)} * b_1 + g_{L-3}^{(2)} * s_{L-2}^{(n+2)} + \ldots + g_1^{(2)} * s_2^{(n+2)} + g_0^{(2)} s_1^{(n+2)} \quad (5d)$$

The convoluted states signal generators 360 include combinatorial logic for generating the outputs defined by the equations (5a) through (5d). For clarity, only the combinatorial logic of the convoluted states signal generator 360-0 is shown. However, it would be known to one skilled in the art how to generate such logic for the convoluted states signal generators 360-1 through 360-3 from the equations (5a) through (5d). The convoluted states signal generator 360-0 includes a plurality of AND gates 364-0 through 364-L-1 and an OR gate 366. The outputs of the AND gates 364-0 through 364-L-1 are applied to respective inputs of the OR gate 366 which generates the signal $v_0^{(n+1)}$.

So for a given state $S^{(n+2)}$, let $\{b_2 b_1\} \in \{00,01,10,11\}$ in a radix-4 decoder. The shift register 302 constructs an extended state $S'^{(n)}$ and the metric index generator 304 generates the four outputs $v_0^{(n)}, v_1^{(n)}, v_0^{(n+1)}$ and $v_1^{(n+1)}$ by using equations 5a–5d. The outputs of the convoluted states signal generators 360 are applied to the combining circuit 362 for generating the branch metric index 118. Specifically, the branch metric index 118 is a branch metric index bi for state transition from the state $$S^{(n)} = (b_2\ b_1\ s_{L-2}^{(n+2)}\ s_{L-3}^{(n+2)} \ldots s_3^{(n+2)}\ s_2^{(n+2)}) \quad (6a)$$

to the state $$S^{(n+2)} = (s_{L-2}^{(n+2)}\ s_{L-3}^{(n+2)} \ldots s_1^{(n+2)}\ s_0^{(n+2)}) \quad (6b)$$

which the circuit 362 provides as $$bi[S^{(n+2)}][b_2 b_1] = v_1^{(n+1)} | v_0^{(n+1)} | v_1^{(n)} | v_0^{(n)} \quad (7)$$

The metric index generator 304 provides the branch index 118 to the branch metric table 120. The branch metrics stored in the branch metrics table 120 are weights that are applied for adjusting the branch transition from the state at time n to a state at time n+2. Specifically, the add/compare/select circuit 114 uses the branch metric table 120 to update the state metrics.

Figure 4:
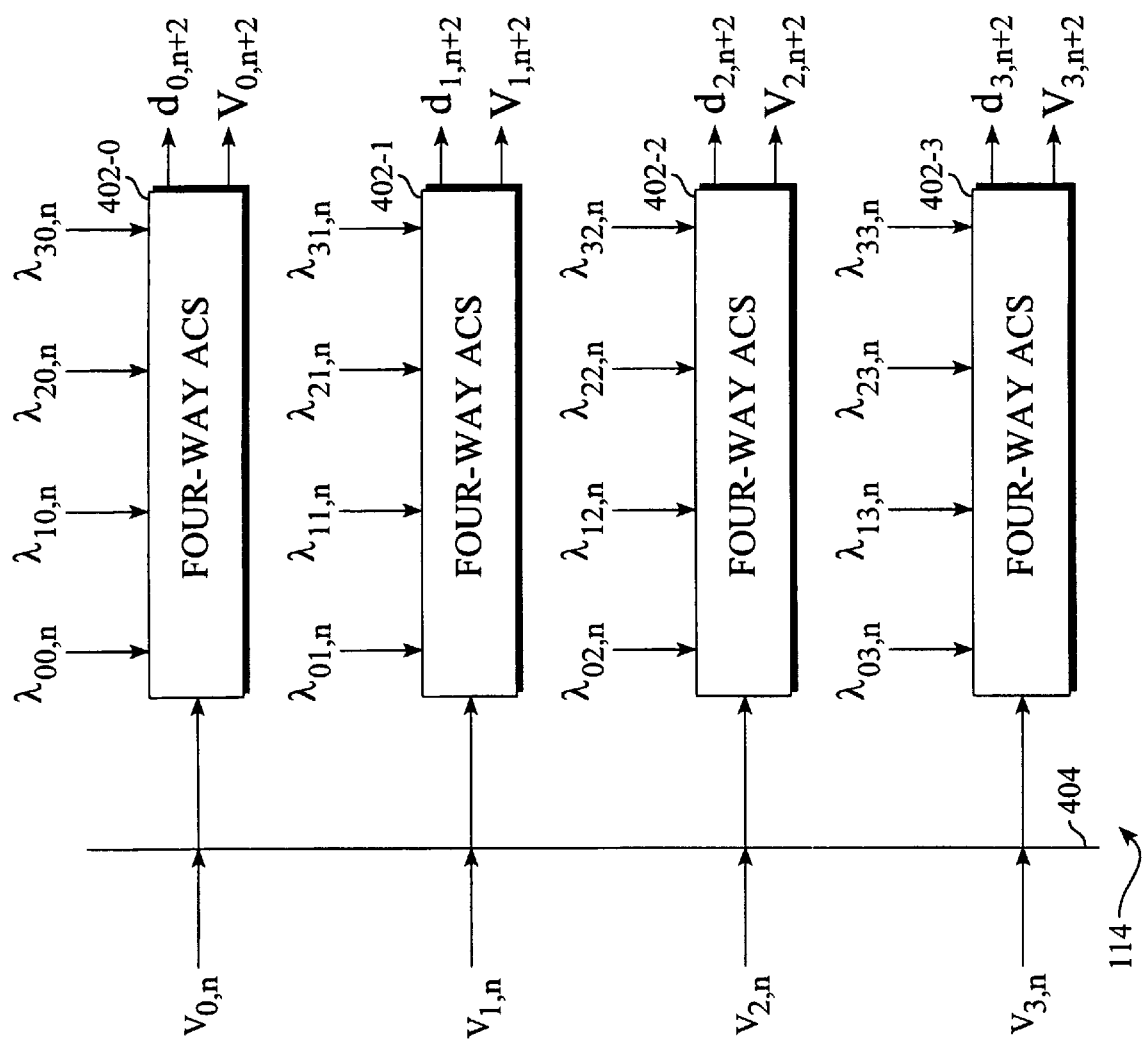
FIG. 4 is a block diagram of a radix-4 add/compare/select circuit of the convolutional code decoder of FIG. 1.

FIG. 4 is a block diagram of the add/compare/select circuit 114 in accordance with the present invention. The add/compare/select circuit 114 includes a plurality of four-way add/compare/select (ACS) circuits 402-0 through 402-3 and an interconnection 404. The branch metric for each state is applied to the interconnection 404 which selectively applies the branch metrics to the four-way ACS circuits 402 in accordance with the trellis diagram 200. In the exemplary trellis diagram shown in FIG. 2, each state at time n+2 may be reached by a branch transition from any state 202 at time n. In some trellis diagrams, some branch transitions do not occur at certain states. In such trellis diagrams, the interconnection 404 accordingly applies the branch metrics to the four-way ACS circuits 402 as indicated by the trellis diagram. The branch metric table 120 applies weights to each of the four-way ACS circuits 402, which adds the branch metric to the state metric for the previous states, compares the candidate state metric for the current state, and selects the branch transition that causes the smallest state metric. Each four-way ACS circuit 402 provides a state metric and a data indicator that indicates the selected state at the time n+2.

Figure 5:
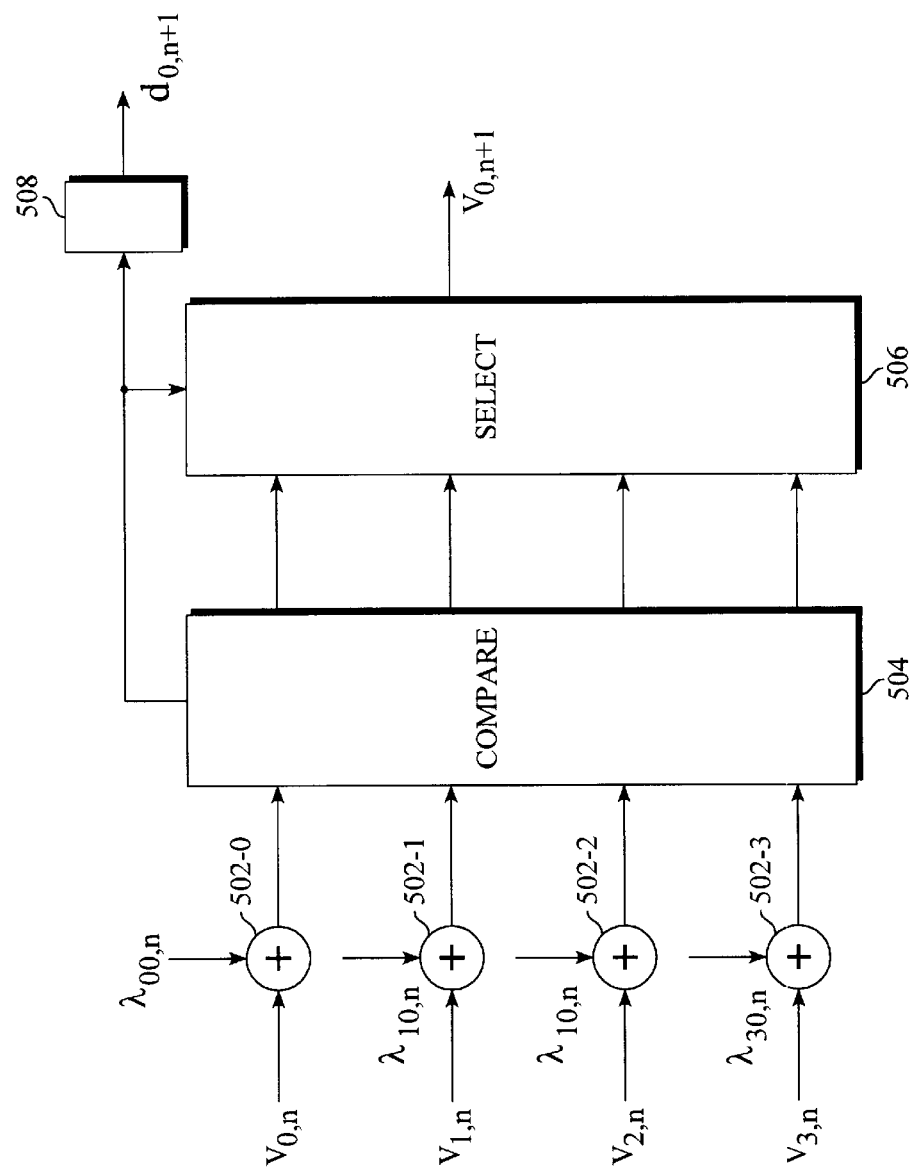
FIG. 5 is a block diagram of a four-way add/compare/select circuit of the add/compare/select circuit of FIG. 4.

FIG. 5 is a block diagram of a four-way ACS circuit 402 in accordance with the present invention. The four way ACS circuit 402 includes a plurality of adders 502-0 through 502-3, a compare circuit 504, a select circuit 506, and a data buffer 508.

For a given state 204, a state metric v corresponding to a previous state 202 is applied to a corresponding adder 502. Specifically, the state metric $v_{0,n}$ for state 00 is applied to one input of the adder 502-0. Likewise, the state metrics v for states 01, 10, and 11 are applied to one input of the adders 502-1, 502-2, and 502-3, respectively. In addition, the branch metric table 120 applies branch metrics λ to each of the adders 502 that corresponds to the branch transition. Specifically, the branch metric for the transition from the previous state 00 is applied to another input of the adder 502-0. Likewise, the branch metric λ for the branch transitions from previous state 01, 10, and 11 are applied to another input of the adders 502-1, 502-2 and 502-3, respectively.

The adder 502 sums the two inputs and applies the sum to the compare circuit 504. In response to the sum signal, the compare circuit 504 compares the state metrics, and the select circuit 506 selects the branch transition having the smallest state metric. The compare circuit 504 also generates a data value $d_{0,n+1}$ which is applied to the select circuit 506 and applied via the data buffer 508 to the path memory 123. The new accumulated state metric is used for the next add/compare/select calculation at the next bit time.

The present invention provides branch metrics and branch indices for a convolutional code Viterbi decoder. The number of states of the convolutional codes are $2^{L-1}$ where L is an integer. In one embodiment of the present invention, the integer L is between 3 and 11 inclusively. The radix-4 add/compare/select circuit allows the convolutional code decoder to be fully parallel, fully serial, or partial parallel by specifying the number of processors $n_p$ where $n_p$ is the divisor of the number of states.

What is claimed is:

1. A method for generating branch metric indices for Viterbi decoding, the method comprising:

generating states of an encoder at selected first and second times;

generating branch indices and generator polynomials in response to the states of the encoder at each of the first and second times;

generating first and second parallel data signals in response to data received at the selected first and second times, respectively;

generating a branch metric in response to the branch indices by:

generating a branch metric table, including table elements representing a sum of the first and second parallel data signals and the inverses of the first and second data signals; and retrieving from the branch table a branch metric corresponding to at least one generated branch metric.

2. The method of claim 1, further comprising generating output data as a convolution of said generated first and second data signals and said generator polynomials.

3. A Viterbi decoder comprising:

a branch index generator for generating a plurality of branch indices, each branch index corresponding to a branch transitions between a first plurality of states and a second plurality of states indicative of received data and to convolutional code polynomials;

a branch metric table for receiving and storing branch metrics indicative of received data at selected first and second times, the branch metric table including sixteen elements, with each element corresponding to combinations of a sum of (i) the first and second parallel data signals at the first and second times and (ii) inverses of the first and second parallel data signals at the first and second times; and a selection circuit coupled to the branch metric table for selecting, for each one of the first plurality of states, a corresponding one of the second plurality of states in response to the branch indices corresponding to the each one of the first plurality of states.

4. The Viterbi decoder of claim 3, further comprising a state generator for generating said first and second pluralities of states indicative of received data at said respective first and second times.

5. The Viterbi decoder of claim 4, wherein said state generator includes a shift register that provides state signals indicative of shifted bits of said received data.

6. The Viterbi decoder of claim 3, wherein said first plurality of states is defined as $$S^{(n)} = (b2\ b1\ S_{L-2}^{(n+2)}\ S_{L-3}^{(n+2)}\ \ldots\ S_3^{(n+2)}\ S_2^{(n+2)}),$$

said second plurality of states is defined as $$S^{(n)} = (S_{L-2}^{(n+2)}\ S_{L-3}^{(n+2)}\ \ldots\ S_1^{(n+2)}\ S_0^{(n+2)}),$$

said branch metric, denoted bi $\{S^{(n+2)}\}$ [b1 b2], is defined as $$bi[S(n+2))\ [b1\ b2] = v_1^{(n+1)} | v_0^{(n+1)} | v_1^{(n)} | v_0^{(n)},$$

said branch metric indices $v_0^{(n+1)}$, $v_1^{(n+1)}$, $v_0^{(n)}$, $v_1^{(n)}$ are defined by $$v_0^{(n+1)} = g_{L-1}^{(1)} * b1 + g_{L-2}^{(1)} * s_{L-2}^{(n+2)} +$$
$$g_{L-3}^{(1)} * s_{L-3}^{(n+2)} + \cdots + g_1^{(1)} * s_1^{(n+2)} + g_0^{(1)} * s_0^{(n+2)},$$

$$v_1^{(n+1)} = g_{L-1}^{(2)} * b1 + g_{L-2}^{(2)} * s_{L-2}^{(n+2)} +$$
$$g_{L-3}^{(2)} * s_{L-3}^{(n+2)} + \cdots + g_1^{(2)} * s_1^{(n+2)} + g_0^{(2)} * s_0^{(n+2)},$$

$$v_0^{(n)} = g_{L-1}^{(1)} * b2 + g_{L-2}^{(1)} * b1 + g_{L-3}^{(1)} * s_{L-3}^{(n+2)} +$$
$$\cdots + g_1^{(1)} * s_1^{(n+2)} + g_0^{(1)} * s_0^{(n+2)},$$

$$v_1^{(n)} = g_{L-1}^{(2)} * b1 + g_{L-2}^{(2)} * b2 + g_{L-3}^{(2)} * s_{L-3}^{(n+2)} +$$
$$\cdots + g_1^{(2)} * s_1^{(n+2)} + g_0^{(2)} * s_0^{(n+2)},$$

and said convolutional code polynomials are defined as $$g^{(1)} = (g_0^{(1)}\ g_1^{(1)}\ \ldots\ g_{L-3}^{(1)}\ g_{L-2}^{(1)}\ g_{L-1}^{(1)}),$$

$$g^{(2)} = (g_0^{(2)}\ g_1^{(2)}\ \ldots\ g_{L-3}^{(2)}\ g_{L-2}^{(2)}\ g_{L-1}^{(2)}).$$

7. The Viterbi decoder of claim 3, wherein said branch index generator comprises:

a shift register for shifting said received data at said respective first and second times; and a metric index generator for generating selected metric indices in response to said states from the shift register and said convolutional code polynomials.

* * * * *